(12) United States Patent
Chiaretti

(10) Patent No.: US 7,482,633 B2
(45) Date of Patent: Jan. 27, 2009

(54) MULTI-SOURCE OPTICAL TRANSMITTER AND PHOTONIC VISUALIZATION DEVICE

(75) Inventor: Guido Chiaretti, Novate Milanese (IT)

(73) Assignee: STMicroelectronics S.r.l., Agrate Brianza (Milan) (IT)

(*) Notice: Subject to any disclaimer, the term of this patent is extended or adjusted under 35 U.S.C. 154(b) by 171 days.

(21) Appl. No.: 11/311,913

(22) Filed: Dec. 19, 2005

(65) Prior Publication Data

US 2006/0139915 A1 Jun. 29, 2006

(30) Foreign Application Priority Data

Dec. 23, 2004 (IT) .................. RM2004A0633

(51) Int. Cl.
*H01L 33/00* (2006.01)
(52) U.S. Cl. .............. 257/89; 257/98; 257/99; 257/E33.058; 257/E33.073; 362/231; 362/364; 362/375
(58) Field of Classification Search ........... 362/230, 362/231, 362, 364, 375; 257/88, 89, 98, 257/99, E33.056, E33.058, E33.072, E33.073
See application file for complete search history.

(56) References Cited

U.S. PATENT DOCUMENTS

| 6,715,901 | B2 * | 4/2004 | Huang ..................... 362/294 |
| 6,874,910 | B2 * | 4/2005 | Sugimoto et al. .......... 362/294 |
| 6,998,281 | B2 * | 2/2006 | Taskar et al. ................ 438/29 |
| 7,281,860 | B2 * | 10/2007 | Fujita ........................ 385/88 |
| 2004/0124430 | A1 * | 7/2004 | Yano et al. .................. 257/98 |
| 2004/0196643 | A1 * | 10/2004 | Terada et al. ................. 362/3 |
| 2005/0218468 | A1 * | 10/2005 | Owen et al. ................ 257/433 |
| 2005/0242632 | A1 * | 11/2005 | Asbach et al. ............. 297/148 |
| 2006/0124953 | A1 * | 6/2006 | Negley et al. ................ 257/99 |
| 2008/0048200 | A1 * | 2/2008 | Mueller et al. ............... 257/98 |

* cited by examiner

*Primary Examiner*—Minh-Loan T Tran
(74) *Attorney, Agent, or Firm*—Hogan & Hartson LLP

(57) ABSTRACT

A multi-source optical transmitter includes a substrate of semiconductor material and a plurality of semiconductor optical sources suitable to provide optical signals having respective wavelengths defining base colors for the formation of colored images in said visualization device. The sources are arranged according to a matrix pattern on one face of the substrate.

15 Claims, 4 Drawing Sheets

MULTI-SOURCE OPTICAL TRANSMITTER AND PHOTONIC VISUALIZATION DEVICE

RELATED APPLICATION

The present application claims priority of Italian Patent Application No. RM2004A00633 filed Dec. 23, 2004, which is incorporated herein in its entirety by this reference.

FIELD OF THE INVENTION

The present invention relates to the technical field of visualization devices and in particular to a multi-source optical transmitter which can be used in a visualization device and further relates to a photonic visualization device.

BACKGROUND OF THE INVENTION

As in many other fields, the arrival of digital technology has brought numerous innovations also to the field of visualization devices. For example, the normal cathode ray tube (CRT) displays, even though they can still offer high quality images, are now generally considered as too sensitive to disturbances and aesthetically unpleasant, heavy and cumbersome. In fact, the depth of the cathode ray tube increases proportionally to the diagonal size of the display.

For this reason, the CRT displays are today considered less attractive than the plasma or liquid crystal display (LCD) visualization devices which, on the contrary, can be made with a much greater diagonal screen size than that of a cathode ray display, while at the same time maintaining a reasonable depth. Therefore, they can be inserted easily into any environment, offering images without the deficiencies associated with CRT displays.

Today an innovative generation of visualization devices is being developed and experimented with which operate according to a working principle different from the working principles of the visualization devices made with LCD technology or plasma technology. These new generation visualization devices, which may be defined as "photonic" visualization devices, provide for the use of an innovative optic type technology which, to form images on the display, provides for the deflection of numerous modulated optical signals output from respective optical fibers fed by optical signal sources.

In these photonic visualization devices, a large sized screen is divided into a plurality (e.g., 6 or 12) of smaller sized screens or sub-screens, each comprised in a respective visualization unit.

With reference to FIG. 1, a visualization unit 1 is shown which includes a sub-screen 8 on which an image is formed by means of optical signals output from the end sections of two groups 9 of optical fibers. The end sections of each group 9 of optical fibers are inserted into suitable perforated mechanical supports 2.

The optical signals output from the two groups 9 of fibers are optically processed by first optical means, e.g., they are collimated by means of lenses 3, then deviated by reflecting elements 6 and then again collimated by further lenses 4 before being deviated by a rotating mirror which projects said beams on to the portion of the screen 8. Further optical processing means 7 (post-processing means) can be provided. on the optical path between the rotating mirror 5 and the portion of screen 8 on which the images are formed.

FIG. 2 shows a perspective view of a perforated mechanical support 2 into which the end sections of optical fibers 10, 11, 12 of a single group of fibers 9 are inserted. For simplicity, only three optical fibers 10, 11, 12 are shown in the figure while, in reality, the support 2 is intended to receive a much greater number of fibers.

The reference number 13 indicates a group of holes vertically aligned in three columns. Each column of the group 13 includes 32 holes for the insertion of a corresponding number of optical fibers. Thus, each support is intended to accommodate 96 end sections of respective optical fibers. The number of optical fibers necessary, therefore, for the manufacture of a photonic visualization device comprising twelve visualization units is equal to approximately 2300.

As a result of the large number of fibers, the manufacturing of a photonic visualization device has the disadvantage of being in practice, a very long, complex and delicate operation.

Apart from these practical difficulties, the presence of optical fibers poses a more serious problem due to the difficulty of using an automated industrial process for large scale production.

SUMMARY OF THE INVENTION

The object of the present invention is to provide a multi-source optical transmitter which makes it possible to overcome the above said disadvantages and problems in the manufacture of photonic visualization devices.

This object is reached by means of a multi-source optical transmitter which includes a substrate of semiconductor material and a plurality of semiconductor optical sources arranged according to a matrix pattern on one face of the substrate and suitable to supply optical signals having respective wavelengths defining base colors for the formation of colored images.

The optical sources preferably are thermally coupled by conduction to the substrate. The optical sources may be discrete semiconductor devices placed on and fixed to said face of the substrate. In one embodiment, the optical transmitter are semiconductor laser diodes. The optical sources are preferably integrated into the substrate. Preferably, the sources are LED sources including Bragg mirrors.

In one aspect of the invention, the optical sources, on the basis of their position, output a respective optical signal having a central wavelength substantially belonging to the red color spectrum or to the blue color spectrum or to the green color spectrum, so as to form colored images by means of combinations of the three base colors RGB.

In another aspect of the invention, a matrix of sources includes sources aligned in four columns and wherein the number of sources with emission into the green spectrum is substantially twice that of both the number of sources with emission into the blue spectrum and the number of sources with emission into the red spectrum.

In yet another aspect of the invention, a multi-source optical transmitter has arranged on the face of the substrate, a grid of walls defining a number of cavities equal to the number of optical sources included in the matrix of sources, each of said cavities being substantially centered and aligned around a respective optical source. The cavities are preferably filled by an optical resin having a refractive index suitable to improve the efficiency of the extraction of photons from said optical sources. The refractive index is preferably >1.5.

A preferred use of the multi-source optical transmitter of the present invention is when incorporated into a photonic visualization device.

BRIEF DESCRIPTION OF THE DRAWINGS

Further features and advantages of the present invention will become more apparent from the following detailed description of an exemplary but non-limiting embodiment thereof, as illustrated in the accompanying drawings, in which.

In the attached figures, equal or similar elements are indicated with the same reference numbers.

DETAILED DESCRIPTION

Figure 3:
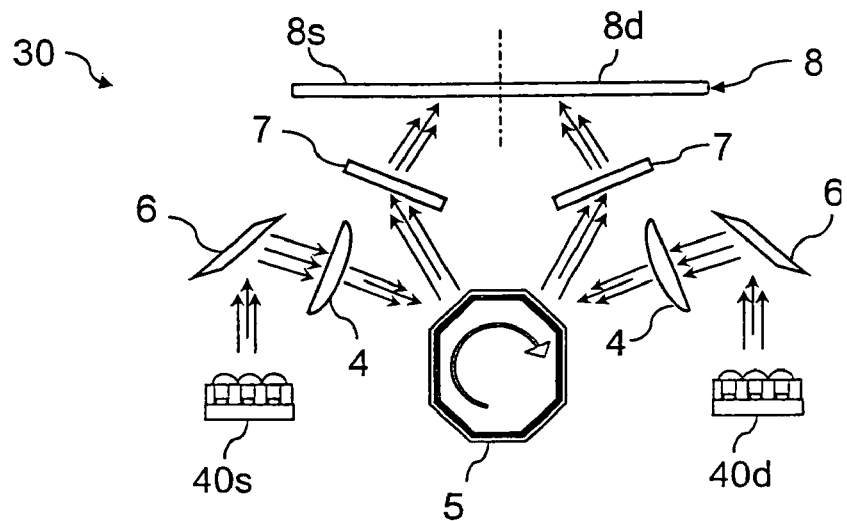
FIG. 3 schematically shows a portion of a photonic visualization device including a pair of multi-source optical transmitters according to the invention.

FIG. 3 schematically represents a portion of a photonic visualization device. In particular, FIG. 3 schematically represents a visualization unit 30 of a photonic visualization device. The latter includes, for example, twelve visualization units 30. Preferably, the visualization unit 30 includes a portion of a screen 8 of the photonic visualization device and includes means for the formation of images to be visualized on said portion of screen 8. In particular, the visualization unit advantageously includes a pair of multi-source optical transmitters 40s, 40d suitable to generate respective optical signals for the formation of images on the screen portion 8.

The visualization unit 30 preferably includes a rotating mirror 5, first optical processing means in the optical path between the multi-source transmitters 40s, 40d and the rotating mirror 5 and second optical processing means in the optical path between the rotating mirror 5 and the screen portion 8.

The first optical processing means include, for example, for each multi-source optical transmitter 40s, 40d, a flat reflecting element 6, a collimator lens 4 interposed between the flat reflecting element 6 and the rotating mirror 5. The second optical processing means include, for example, an optical component 7 suitable to deviate the optical beam by refraction. The optical component 7 is, for example, a thin sheet of glass.

In a particularly preferred embodiment, the rotating mirror 5 includes a motorized polygonal reflector.

In the visualization unit 30, the images are formed on the screen portion 8, deflecting the optical signals received output from the multi-source optical transmitters 40s, 40d so as to produce a periodic scansion of the area of said screen portion 8.

In particular, the optical signals output from the two multi-source optical transmitters 40s, 40d are optically processed by the first optical processing means before being reflected by the rotating mirror 5 and deviated by the glass sheets 7 to be projected on to the screen portion 8.

In a particularly preferred embodiment, the optical signal output from each multi-source transmitter 40s, 40d, by means of the rotating mirror 5, scans a respective half 8s, 8d of the screen portion 8. More preferably, the optical signal received output from the multi-source optical transmitter 40s is such as to scan the left half 8s of the screen portion 8 for first groups of lines and from left to right. Furthermore, the optical signal received output from the multi-source optical transmitter 40d is such as to scan the right half 8d of the screen portion 8 for second groups of lines and from right to left. In a particularly advantageous embodiment, the second groups of lines comprise lines of the screen which are staggered (e.g., a quantity equal to half of the distance between two adjacent lines) compared to lines belonging to corresponding first groups of lines.

Figure 4:
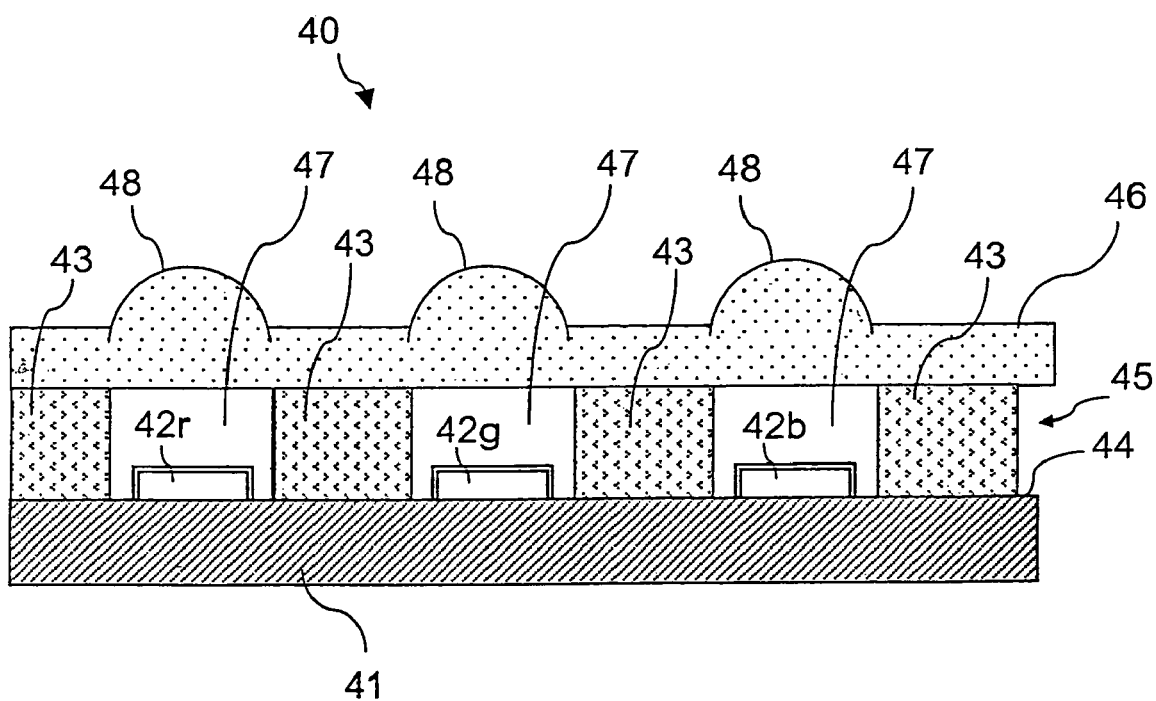
FIG. 4 schematically shows a partial lateral cross-section of a first embodiment of a multi-source optical transmitter.

FIG. 4 schematically represents a partial lateral cross-section of a particularly preferred embodiment of a multi-source optical transmitter 40 according to the present invention. For example, the transmitters indicated with 40s and 40d in FIG. 3 are identical to the transmitter 40 shown in FIG. 4.

The multi-source optical transmitter 40 includes a substrate 41 of semiconductor material and a plurality of semiconductor optical sources 42r, 42g, 42b spatially arranged, according to a matrix arrangement pattern, on one face 44 of the substrate 41 and thermally coupled to this by conduction. In a particularly advantageous embodiment, the substrate 41 includes a wafer in silicon or other semiconductor material having a thermal conductivity similar to that of silicon or greater.

The optical sources 42r, 42g, 42b are adapted to provide, on the basis of their position inside the matrix, optical signals having respective wavelengths which together define base colors for the formation of colored images on the screen portion 8.

In a first embodiment, the optical sources 42r, 42g, 42b are laser sources, preferably of the VCSEL type (Vertical Cavity Surface Emitting Laser). Alternatively, the optical sources are LED sources (Light Emitting Diode).

In a particularly preferred embodiment, each of said semiconductor optical sources 42r, 42g, 42b can output, on the basis of its position, an optical signal with a central wavelength substantially belonging to the red color spectrum or to the blue color spectrum or to the green color spectrum, in such a way as to be able to form colored images by combining the set of three base colors RGB. For example, in the particular embodiment in FIG. 3 the optical source 42r outputs a red color (R) optical signal, the optical source 42g outputs a green color (G) optical signal and the optical source 42b outputs a blue color (B) optical signal.

The matrix arrangement pattern is not visible in FIG. 4 which, representing a lateral cross-section of the multi-source transmitter 40, only makes visible one line of the matrix comprising three optical sources 42r, 42g, 42b. The remaining optical sources, not visible in FIG. 4, are substantially aligned in the transmitter 40 along the three columns identified by the optical sources 42r, 42g and 42b respectively. Preferably, each column of optical sources comprises thirty-two or thirty-three semiconductor optical sources. In particular, the presence of thirty-three sources in each column advantageously makes it possible to have minimum redundancy in the case of breakdown of one or more sources.

In a particularly advantageous embodiment, the number of columns of sources comprised in the multi-source transmitter 40 is equal to four instead of equal to three, so that it is possible to foresee a number of optical sources with emission into the green spectrum equal to double the number of optical sources with light emission into the red spectrum and of optical sources with emission into the blue spectrum. This alternative is particularly advantageous since it makes it possible to compensate for the fact that the sources which emit light into green, using the same power supply, emit light with a lower optical power (equal to about one half) compared to sources which emit light into blue or red.

Preferably, in accordance with the view shown in FIG. 4, the optical sources 42*r*, 42*g*, 42*b* are bare chip semiconductor sources, i.e. without packaging, positioned and fixed on to a face 44 of the substrate 41 which acts as an assembly substrate. For example, the optical sources are assembled, i.e., glued or welded to the face 44 of the substrate 41. In this case, the substrate 41 preferably includes electrical paths to which the electrical terminals (not shown) of each optical source are connected. Furthermore, in the case where the multi-source transmitter includes discrete optical sources assembled on the assembly substrate 41, it is preferable for the sources and the substrate to be made of semiconductor materials having similar or equal coefficients of thermal expansion so as to avoid damage to the optical sources due to a different degree of thermal expansion of the substrate compared to the sources.

In a particularly advantageous embodiment, the multi-source optical transmitter 40 includes, among spatially adjacent optical sources, separation walls 43 which rise from the same face 44 of the substrate 41 on which the optical source matrix is located. Preferably, said walls 43 are arranged and linked together so as to form a grid 45 of walls defining a number of cavities 47 equal to the number of optical sources included in the matrix, each of said cavities 47 being substantially centered and aligned around a respective semiconductor optical source. Grid 45 can be made of any material, for example plastic or semiconductor material, provided that the material is not transparent to the wavelengths of the optical sources comprised in the multi-source transmitter, so as to optically insulate them one from the other.

As illustrated in FIG. 4, the multi-source optical transmitter 40 further comprises a transparent covering element 46, which can be fixed to the grid so that the cavities 47 of the grid form internal chambers defined below by the substrate 41 and above by the covering element 46 and laterally by the walls 43 of the grid 45. Preferably, each internal chamber is such as to house a respective optical source. Preferably, the transparent covering element 46 is made in material, plastic or glass, substantially transparent to the wavelengths of the optical sources of the multi-source transmitter 40. In this case, grid 45 acts as a spacing element between the transparent covering element 46 and the base substrate 41.

In a particularly advantageous embodiment, the internal chambers defined between the substrate 41, the transparent covering element 46 and the grid 45 of lateral walls 43 are filled with an optical resin having a high refractive index (e.g. greater than 1.5 and preferably equal to approximately 1.8 or greater), so as to increase the efficiency of photon extraction from the optical sources in order to obtain the most brilliant sources possible. "High refractive index" means a refractive index significantly greater than the refractive index of air.

With continued reference to FIG. 4, preferably the covering element includes a lens matrix 48 to focus/collimate the optical signals output from the semiconductor optical sources. The lens matrix includes a plurality of lenses 48, each of which is aligned to a respective optical source 42*r*, 42*g*, 42*b*. Preferably, the lens matrix 48 forms an integral part with the covering element 46, for example by means of molding.

Advantageously, the presence of the grid 45 as a spacing element between the substrate 41 and the covering element 46 makes it possible to position the covering element 46 in such a way that the sources 42*r*, 42*g*, 42*b* are arranged approximately within the focus of the respective lenses 48.

Figure 5:
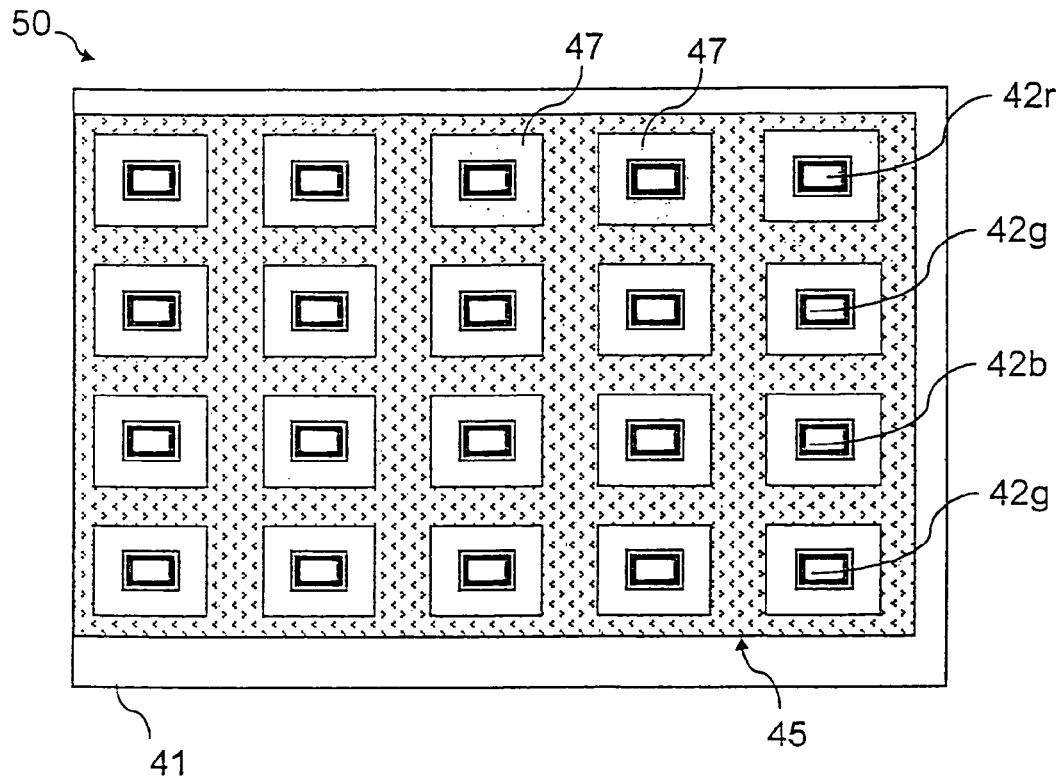
FIG. 5 schematically shows a partial plan view of a multi-source transmitter whose covering element has been removed.

FIG. 5 shows a partial plan view of a multi-source optical transmitter 50 comprising four columns of sources. In the view shown in FIG. 5, only five of the thirty-three lines of optical sources are visible, each including four semiconductor optical sources. In addition, the view in FIG. 5 represents a multi-source optical transmitter 50 where the covering element has been removed (indicated in FIG. 4 with the reference number 46), in order to make the structure of the grid 45 more visible.

Figure 6:
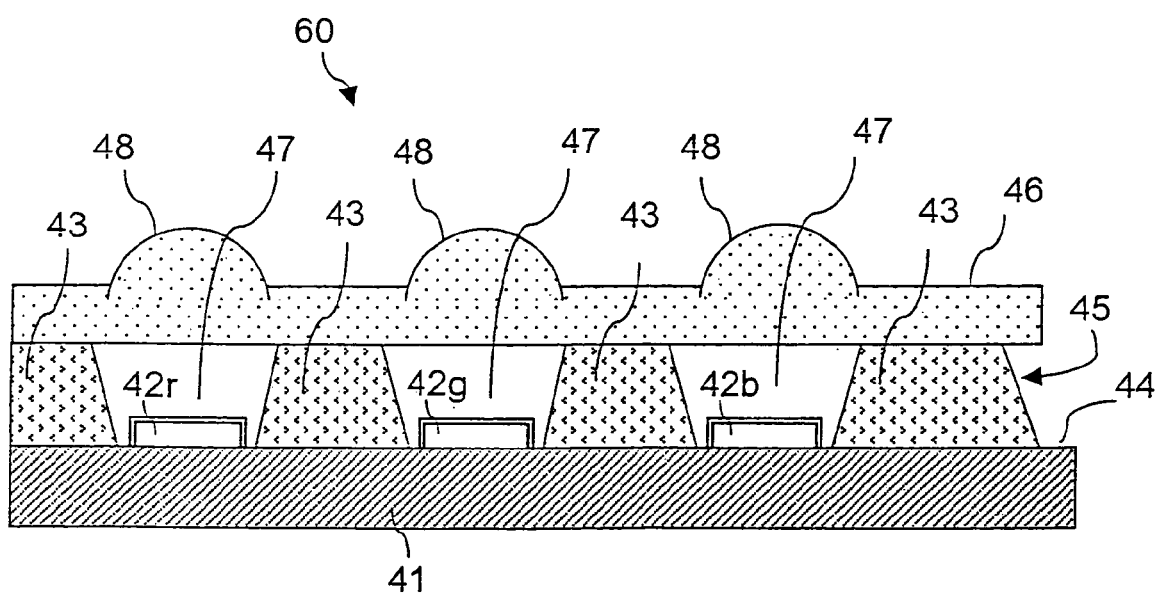
FIG. 6 schematically shows a partial lateral cross-section of a second embodiment of a multi-source optical transmitter.

FIG. 6 shows a partial lateral cross-section of a further embodiment of a multi-source optical transmitter 60, which differs from the multi-source transmitter 40 in FIG. 4., in that the lateral walls 43 of the grid 45 include transversal sides of the substrate 41 which are inclined compared to the face of the substrate on which the semiconductor optical sources are positioned, instead of being perpendicular to it (as is the case in FIG. 4). In this embodiment, the walls 43 of the grid 45 which define the cavities 47 have a substantially trapezoidal profile. This alternative makes it possible to catch, through reflection on the inclined side walls of the grid 45, any optical rays emitted by sources in directions very different from the main emission optical axis (which is, for example, substantially perpendicular to the substrate 41), for example almost parallel to the face of the substrate 41 on which the optical sources 42*r*, 42*g*, 42*b* are arranged. In this way, the inclined sides of the walls 43 make it possible to direct said very different optical rays towards the respective collimator lenses 48. Advantageously, in this case, the grid also acts as an optical collector. Preferably, but without limitation, the inclined sides of said lateral walls 43 can be coated with metallization in order to increase their reflecting effect.

Advantageously, with reference to the embodiment shown in FIG. 6, it is possible also in this case to fill the cavities 47 with optical resin in order to increase the efficiency of photon extraction from the semiconductor optical sources.

The above-described embodiments of a multi-source transmitter include optical sources arranged and fixed on to one face of the substrate 41. The above-described multi-source transmitters can be produced industrially taking advantage of all the known alignment, fixing and welding processes, now with low costs and used widely in the field of semiconductor circuit production. In particular, the optical sources can be aligned, positioned and fixed on to one face of the substrate by means of the so-called low precision "Pick & Place" techniques (e.g. equal to ±5 micron).

Figure 7:
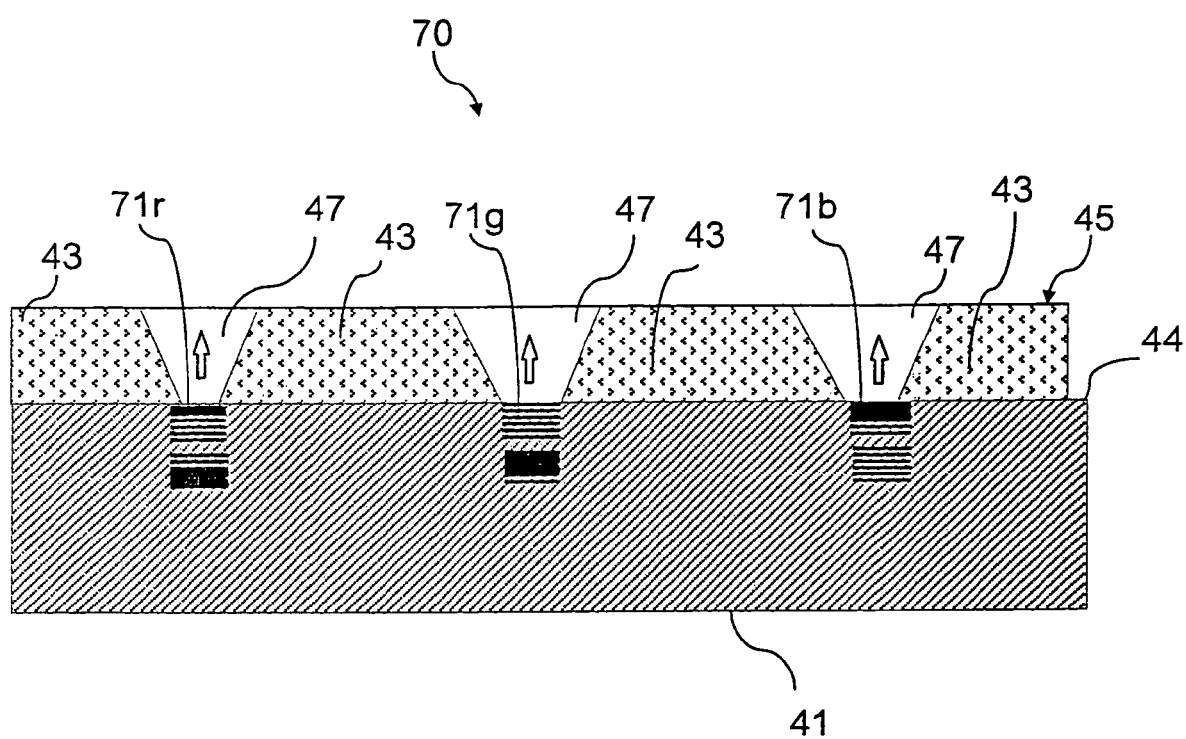
FIG. 7 schematically shows a partial lateral cross-section of a third embodiment of a multi-source optical transmitter.

Further simplification of the production process and product structure can be advantageously obtained by means of the embodiment of a multi-source transmitter illustrated in a lateral cross-section in FIG. 7.

The multi-source transmitter 70 in FIG. 7 comprises integrated semiconductor optical sources 42*r*, 42*g*, 42*b* arranged near one face of the silicon substrate 41 and integrated into said substrate. In this case, the different colored optical sources are made including mirrors or Bragg reflectors inside the silicon substrate by means of the technique now known as "Silicon Photonics".

Advantageously, in this case the optical source matrix can be positioned with very high precision on to the substrate 41 and the use of the above-mentioned "Pick & Place" positioning technique can be avoided, so reducing production costs.

Similarly to the above descriptions regarding the previous embodiments, it is also possible in this case to provide a grid 45 with walls having inclined sides and a covering element provided with a matrix of collimator lenses (not shown, for simplicity, in FIG. 7). Furthermore, it is also possible to provide, for the embodiment in FIG. 7, an optical resin to fill the cavities 47 of the optical grid 45 in order to increase the efficiency of the photon extraction from the Bragg reflector optical sources. Further improvement can be obtained by making the optical sources in such a way as to adapt the respective upper Bragg mirrors to the refractive index of the optical resin used.

Figure 1:
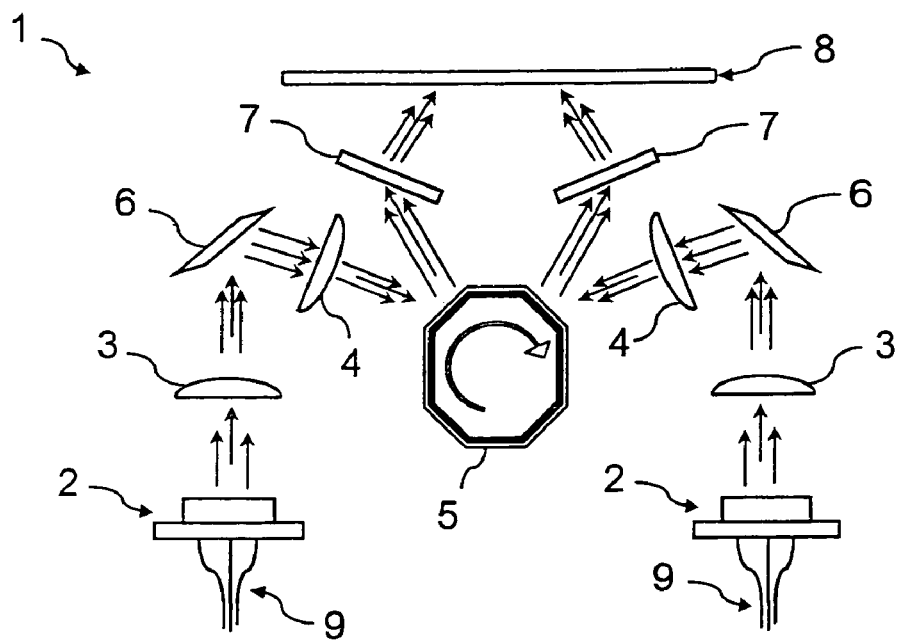
FIG. 1 schematically shows a portion of a photonic visualization device including perforated mechanical supports for the introduction of optical fibers.
Figure 2:
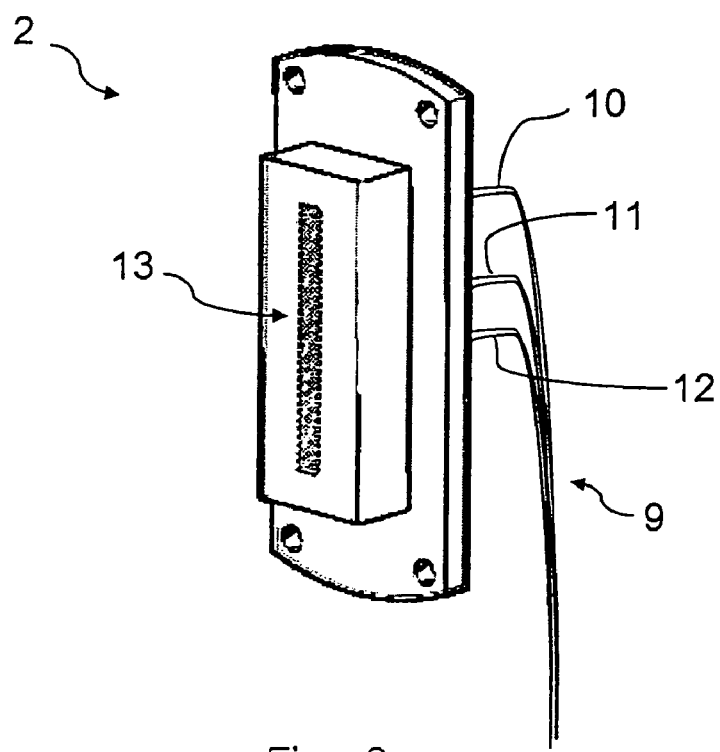
FIG. 2 shows a perspective view from above of a perforated mechanical support.

On the basis of the above, it can be seen how the present invention advantageously makes available a multi-source optical transmitter with which it is possible to produce photonic visualization devices with very moderate production costs. In fact, the elimination of optical fibers makes it possible to produce said devices in an almost completely automated manner. Furthermore, the elimination of optical fibers makes it possible to make visualization devices with reduced dimensions. A further reduction in the cost and size is determined by the possibility to foresee a first optical collimation step directly in the same multi-source transmitter. In fact, comparing FIG. 1 with FIG. 3, it can be seen that less optical processing means in the visualization unit in FIG. 3 are required than the visualization unit in FIG. 1.

Advantageously, a multi-source optical transmitter according to the present invention, since it provides for an optical source matrix coupled by conduction to a substrate of semiconductor material, for example silicon, further permits effective dissipation of the considerable quantity of heat produced by said sources. In fact, it should be considered that one single multi-source transmitter (a visualization device comprises even twelve/sixteen of said transmitters) can include more than one hundred optical sources, each of which produces a significant quantity of heat, especially if LEDs are used as optical sources.

Moreover, the possibility of forming a matrix of optical collectors (defined by the grid 45) integrated into the same transmitter, constitutes a further advantage compared to the use of optical fibers instead of multi-source transmitters, since the limited number of openings of each fiber significantly limits the quantity of light emitted by the fiber itself to the external optical collimation means.

Naturally, in order to satisfy contingent and specific requirements, a person skilled in the art may apply to the above-described multi-source transmitter and photonic visualization device according to the present invention many modifications and variations, all of which, however, are included within the scope of protection of the invention as defined by the following claims.

The invention claimed is:

1. A multi-source optical transmitter for a visualization device, the transmitter comprising:
   a substrate of semiconductor material;
   a plurality of semiconductor optical sources suitable to supply optical signals having respective wavelengths defining base colors for the formation of colored images in said visualization device, the sources being arranged according to a matrix pattern on one face of said substrate, wherein the number of sources with emission into the green spectrum is substantially twice that of both the number of sources with emission into the blue spectrum and the number of sources with emission into the red spectrum.

2. The multi-source optical transmitter according to claim 1, wherein said sources are thermally coupled by conduction to the substrate.

3. The multi-source optical transmitter according to claim 1, wherein said optical sources are discrete semiconductor devices placed on and fixed to said face of the substrate.

4. The multi-source optical transmitter according to claim 1, wherein said optical sources are semiconductor laser diodes.

5. The multi-source optical transmitter according to claim 1, wherein said optical sources are semiconductor LED diodes.

6. The multi-source optical transmitter according to claim 1, wherein said optical sources are integrated into said substrate.

7. The multi-source optical transmitter according to claim 6, wherein said sources are LED sources including Bragg mirrors.

8. The multi-source optical transmitter according to claim 1, wherein said optical sources, on the basis of their position, output a respective optical signal having a central wavelength substantially belonging to the red color spectrum or to the blue color spectrum or to the green color spectrum, so as to form colored images by combinations of the three base colors RGB.

9. The multi-source optical transmitter according to claim 1, wherein said matrix of sources includes sources aligned in four columns.

10. The multi-source optical transmitter according to claim 1, further comprising, arranged on said face of the substrate, a grid of walls defining a number of cavities equal to the number of optical sources included in the matrix of sources, each of said cavities being substantially centered and aligned around a respective optical source.

11. The multi-source optical transmitter according to claim 10, wherein said cavities are filled by an optical resin having a refractive index suitable to improve the efficiency of the extraction of photons from said optical sources.

12. The multi-source optical transmitter according to claim 11, wherein said refractive index is greater than 1.5.

13. The multi-source optical transmitter according to claim 10, wherein said walls include sides transversal to the substrate which are inclined compared to said face of the substrate.

14. The multi-source optical transmitter according to claim 1, further comprising a transparent covering element including a matrix of lenses to focus/collimate the optical signals output from the optical sources.

15. A multi-source optical transmitter for a visualization device, the transmitter comprising:
   a substrate of semiconductor material;
   a plurality of semiconductor optical sources suitable to supply optical signals having respective wavelengths defining base colors for the formation of colored images in said visualization device, the sources being arranged according to a matrix pattern on one face of said substrate; and
   arranged on said face of the substrate, a grid of walls defining a number of cavities equal to the number of optical sources included in the matrix of sources, each of said cavities being substantially centered and aligned around a respective optical source; and
   wherein said walls include sides transverse to the substrate which are inclined compared to said one face of said substrate and wherein the number of sources with emission into the green spectrum is substantially twice that of both the number of sources with emission into the blue spectrum and the number of sources with emission into the red spectrum.

* * * * *